United States Patent
Fujihara et al.

(10) Patent No.: US 10,578,145 B2
(45) Date of Patent: Mar. 3, 2020

(54) WASHER-EQUIPPED SCREW

(71) Applicant: DENSO CORPORATION, Kariya, Aichi-pref. (JP)

(72) Inventors: Takeshi Fujihara, Kariya (JP); Satoshi Iguchi, Kariya (JP); Keizo Takamatsu, Kariya (JP); Hidetoshi Uchiyama, Kariya (JP); Yuya Okuda, Toyota (JP); Shuichi Iwata, Toyota (JP); Jun Asada, Toyota (JP)

(73) Assignee: DENSO CORPORATION, Kariya (JP)

( * ) Notice: Subject to any disclaimer, the term of this patent is extended or adjusted under 35 U.S.C. 154(b) by 83 days.

(21) Appl. No.: 15/685,380

(22) Filed: Aug. 24, 2017

(65) Prior Publication Data

US 2018/0058489 A1    Mar. 1, 2018

(30) Foreign Application Priority Data

Aug. 24, 2016   (JP) .................. 2016-163686

(51) Int. Cl.
| | |
|---|---|
| F16B 43/00 | (2006.01) |
| F16B 33/00 | (2006.01) |
| F16B 35/04 | (2006.01) |
| H05K 7/14 | (2006.01) |
| F16B 5/02 | (2006.01) |

(52) U.S. Cl.
CPC .......... *F16B 33/004* (2013.01); *F16B 35/048* (2013.01); *F16B 43/001* (2013.01); *F16B 43/002* (2013.01); *H05K 7/142* (2013.01); *B60Y 2400/61* (2013.01); *F16B 5/0241* (2013.01)

(58) Field of Classification Search
CPC ...... F16B 43/001; F16B 43/002; F16B 35/06; F16B 35/48; F16B 35/048

USPC ........................................ 411/542, 369, 534
See application file for complete search history.

(56) References Cited

U.S. PATENT DOCUMENTS

| | | | | | |
|---|---|---|---|---|---|
| 2,761,347 | A | * | 9/1956 | McKee, Jr. ........... | F16B 43/001 238/DIG. 1 |
| 3,153,971 | A | * | 10/1964 | Lovisek ................ | F16B 43/001 411/369 |
| 3,519,279 | A | * | 7/1970 | Wagner .................. | F16J 15/121 277/637 |
| 3,788,185 | A | * | 1/1974 | Gutshall ................ | F16B 35/06 411/369 |
| 8,297,900 | B2 | * | 10/2012 | Sumiya .................. | F02F 7/006 403/408.1 |
| 2016/0131178 | A1 | | 5/2016 | Shiba | |
| 2018/0058494 | A1 | * | 3/2018 | Fujihara ................ | F16B 39/24 |

FOREIGN PATENT DOCUMENTS

| | | |
|---|---|---|
| JP | H06-307423 A | 11/1994 |
| JP | 2009-052679 A | 3/2009 |

\* cited by examiner

*Primary Examiner* — Flemming Saether
(74) *Attorney, Agent, or Firm* — Oliff PLC

(57) ABSTRACT

A washer-equipped screw is provided with a screw body, a metal washer, and a rubber washer. The screw body includes a cylindrical portion between a shaft portion on which a screw groove is formed and a head portion. A hole in the metal washer is inserted through the cylindrical portion so as to be adjacent to the head portion. A hole in the rubber washer is inserted through the cylindrical portion and positioned on a shaft portion side of the metal washer. A seat surface of the head portion has an inclined surface inclined away from the metal washer toward an outer periphery thereof.

4 Claims, 3 Drawing Sheets

WASHER-EQUIPPED SCREW

CROSS-REFERENCE TO RELATED APPLICATION

This application is based on and claims the benefit of priority from earlier Japanese Patent Application No. 2016-163686 filed Aug. 24, 2016, the description of which is incorporated herein by reference.

TECHNICAL FIELD

The present disclosure discloses a screw equipped with a metal washer and a rubber washer. The screw in the present specification includes a bolt with a polygonal head.

BACKGROUND

There is sometimes an occasion that a screw equipped with a metal washer and a rubber washer is used for fixing a circuit board (refer to Japanese Patent No. 5853997 as Patent Document 1, for example).

A hole in the metal washer is inserted through a shaft portion so as to be adjacent to a head portion of a screw body, and the rubber washer is inserted through the shaft portion as well.

A hole in the washer-equipped screw disclosed in Patent Document 1 pressed down a circuit board by an elastic force of the rubber washer.

A thermal deformation of the circuit board can also be absorbed by the elastic force of the rubber washer.

In the washer-equipped screw disclosed in Patent Document 1, a projection that contacts with the shaft portion of the screw body is formed on an inner peripheral surface of a hole of the rubber washer, so that the metal washer and the rubber washer do not detach.

The metal washer is provided for receiving a reaction force of a head portion side of the rubber washer in a large area when tightening the screw body.

In the washer-equipped screw with which the metal washer contacts a seat surface of the head portion, the metal washer and the seat surface slide against each other when tightening the washer-equipped screw, and a surface layer of the metal washer or the seat surface may be damaged.

Particularly, when the screw body is fastened to the object to be fixed, the metal washer may slide roughly against the seat surface by the reaction force of the rubber washer.

When plating is applied to at least one of the metal washer and the seat surface, there is a possibility that the plating peels off due to sliding and becomes debris.

In a case of the washer-equipped screw for fixing the circuit board, damaged plating (debris) may cause a short circuit on the circuit board.

SUMMARY

An embodiment provides a washer-equipped screw that resists generation of debris.

In a washer-equipped screw according to a first aspect, the washer-equipped screw includes a screw body having a cylindrical portion between a shaft portion on which a screw groove is formed and a head portion. A hole in a metal washer is inserted through the cylindrical portion so as to be adjacent to the head portion. A hole in a rubber washer is inserted through the cylindrical portion and positioned on a shaft portion side of the metal washer. A seat surface of the head portion has an inclined surface inclined away from the metal washer toward an outer radial periphery thereof.

That is, in the washer-equipped screw having the above structure, a gap is formed between the metal washer and the inclined surface of the seat surface before tightening the screw body to an object is started. The gap increases toward the outer periphery.

According to investigation by the inventors, it was found that when the metal washer is deformed and the screw body slides against the metal washer while coming in contact with the metal washer immediately after starting to tighten the screw body, debris tends to be generated.

As described above, a reaction force of the rubber washer also produces grinding between the seat surface and the metal washer, making debris more likely to be generated.

In the washer-equipped screw described above, asymmetry and grinding sliding between the seat surface and the metal washer is reduced at the beginning of tightening of the screw body, and the risk of generation of debris can be reduced.

Further, when tightening the screw, the relative speed of the metal washer and the seat surface increases toward the outer periphery, increasing the risk that debris will be produced.

In the washer-equipped screw described above, since the gap between the metal washer and the seat surface increases toward the outer periphery, the increased risk of production of debris due to the increase in the relative speed is mitigated.

DETAILED DESCRIPTION OF THE PREFERRED EMBODIMENT

Figure 1:
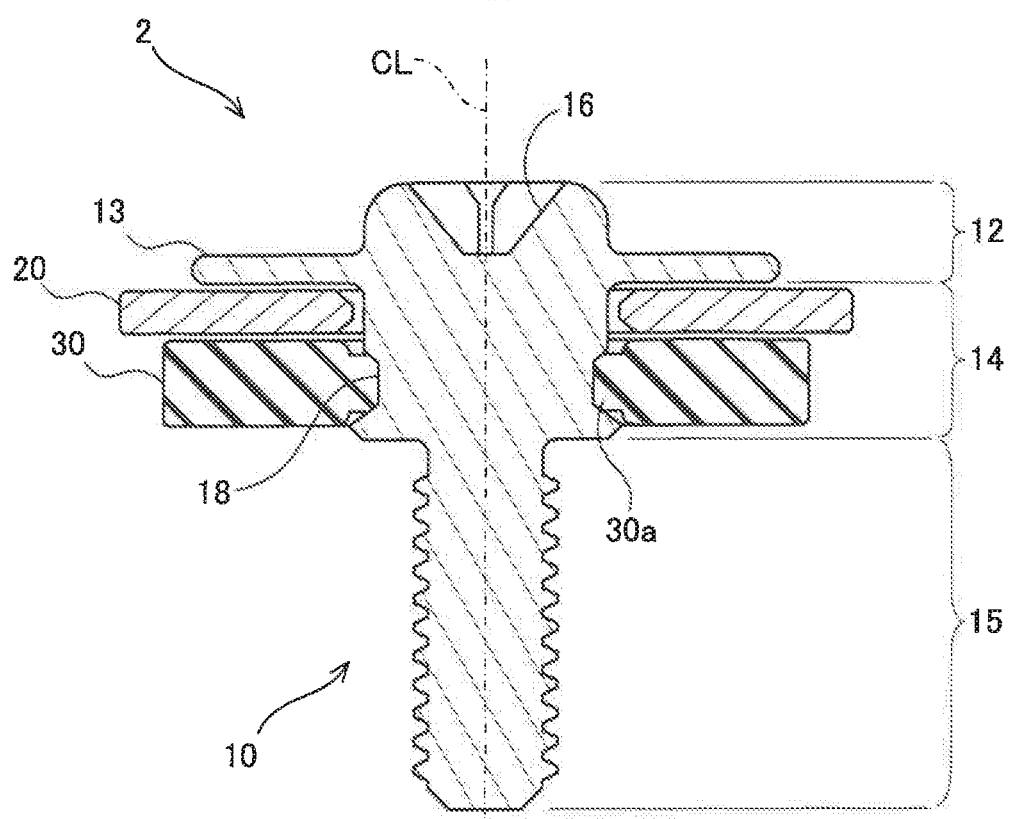
FIG. 1 shows a sectional view of a washer-equipped screw cut along an axial line.

A washer-equipped screw 2 of an embodiment will be described with reference to the drawings.

The washer-equipped screw 2 includes a screw body 10, a metal washer 20, and a rubber washer 30.

The screw body 10 is composed of a head portion 12, a cylindrical portion 14, and a shaft portion 15 in which a thread groove is formed.

The metal washer 20 is a flat washer, and is made of iron, for example.

The cylindrical portion 14 is disposed between the head portion 12 and the shaft portion 15.

The diameter of the cylindrical portion 14 is smaller than the diameter of a flange 13 (mentioned later) but larger than the diameter of the shaft portion 15.

The metal washer 20 and the rubber washer 30 are inserted through the cylindrical portion 14.

The metal washer 20 is positioned on a head portion side, and the rubber washer 30 is positioned on a shaft portion side.

The head portion 12 of the screw body 10 is provided with a groove 16 into which a screwdriver is fitted and the flange 13.

A flange surface on the shaft portion side of the flange 13 corresponds to a seat surface 19 of the screw body 10.

When the washer-equipped screw 2 is fastened to an object, the seat surface 19 (flange surface) receives a reaction force on the head side of the rubber washer 30 through the metal washer 20.

A deformation of the metal washer 20 is suppressed from occurring by receiving the reaction force of the rubber washer 30 at the wide seat surface 19 (flange surface).

Figure 2:
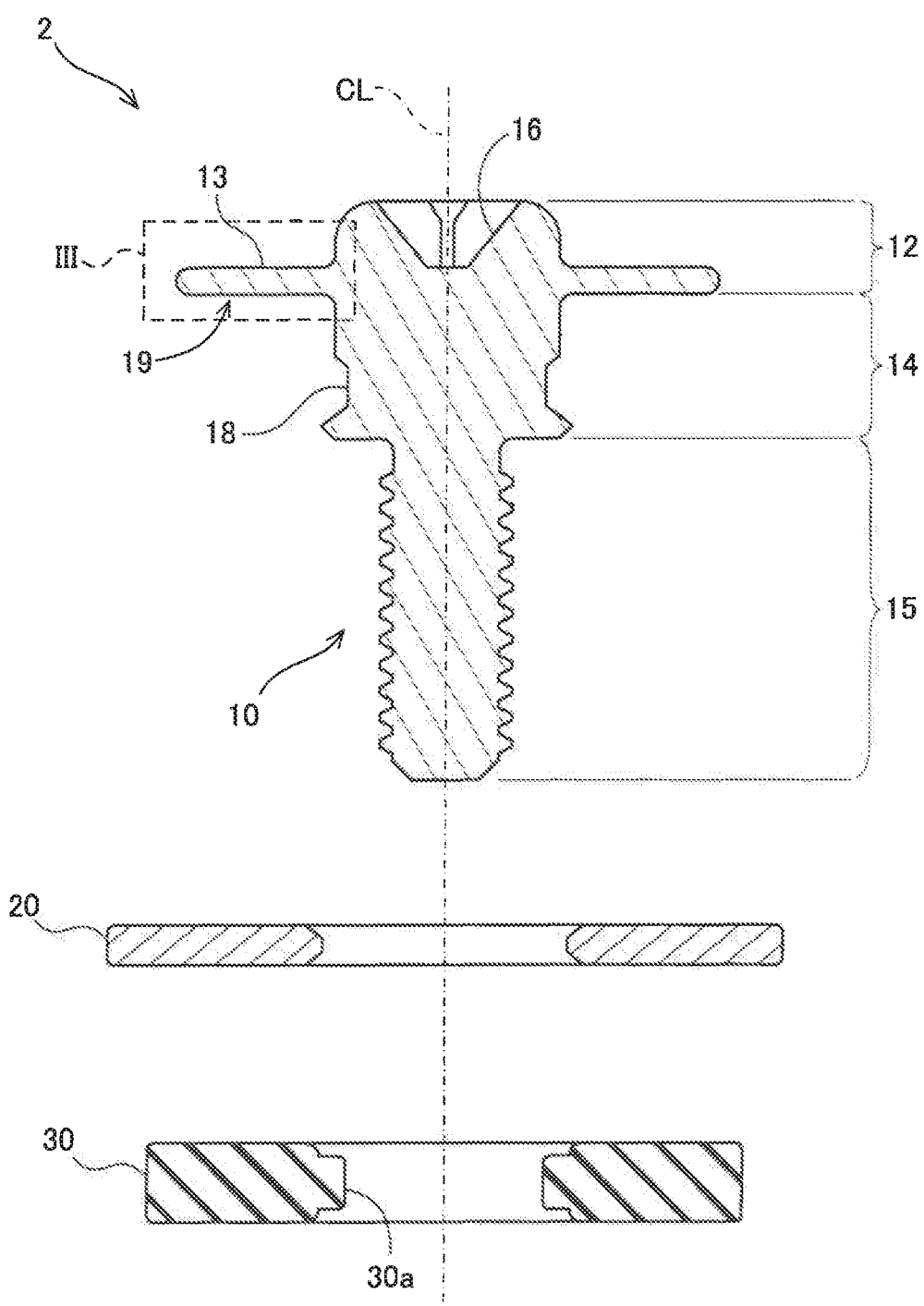
FIG. 2 shows a sectional view of the disassembled washer-equipped screw.

Although the seat surface 19 is drawn flat in FIGS. 1 and 2, the seat surface 19 has a flat surface orthogonal to an axial line CL of the screw body 10 and an inclined surface extending toward an outer side of the flat surface.

The flat surface and the inclined surface of the seat surface 19 will be described later with reference to FIG. 3.

The cylindrical portion 14 is provided with a groove 18 that circulates around a circumference of the cylindrical portion 14.

A rib 30a formed on an inner side of the rubber washer 30 is fitted into the groove 18.

The rubber washer 30 is prevented from detaching from the screw body 10 by the rubber washer 30 being fitted in the groove 18 of the cylindrical portion 14.

Further, the metal washer 20 also does not detach due to the rubber washer 30 being engaged with the cylindrical portion 14.

Figure 3:
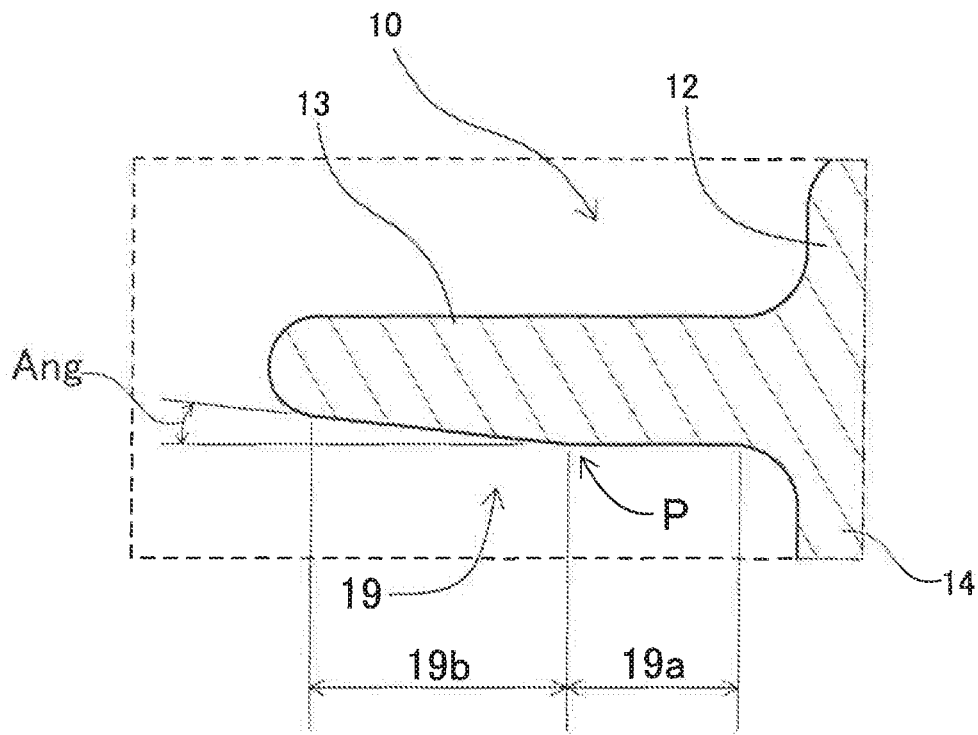
FIG. 3 shows an enlarged view of a part within a dashed rectangle indicated by a reference sign III in FIG. 2.

As shown in FIG. 3, the seat surface 19 of the screw body 10 includes the flat surface 19a on a side close to the cylindrical portion 14 and the inclined surface 19b extending toward the outer side of the flat surface 19a.

As described above, the flat surface 19a is a plane orthogonal to the axial line CL of the screw body 10.

The Inclined surface 19b is inclined away from the metal washer 20 away from the axial line toward the outer radial periphery.

Advantages of the inclined surface 19b will be described.

When fastening the washer-equipped screw 2 to the object, the metal washer 20 and the seat surface 19 slide against each other.

Since the washer-equipped screw 2 is provided with the rubber washer 30, the reaction force of the rubber washer 30 presses the metal washer 20 against the seat surface 19.

Therefore, the metal washer 20 rubs strongly against the seat surface 19.

If the metal washer 20 is warped or there are faint irregularities on the surface, the metal washer 20 and the seat surface 19 locally and strongly slide with each other.

As a result, there is a possibility that a surface layer of either the metal washer 20 or the seat surface 19 may be detached.

In particular, if plating is applied to at least one surface of the metal washer 20 and the seat surface 19, there is a possibility that the plating may be damaged off.

When the washer-equipped screw 2 is used for fixing a circuit board, debris such as a plating peeled off from the metal washer 20 or seat surface 19 may adversely affect the circuit board.

The inclined surface 19b of the seat surface 19 has an effect of reducing local sliding of the metal washer 20 and the seat surface 19 and suppressing debris from being generated.

The relative speed between the metal washer 20 and the seat surface 19 is larger as it reaches the outer periphery of the seat surface 19.

Further, when the metal washer 20 is warped, the magnitude of the out-of-plane deformation of the metal washer 20 is also larger as it reaches the outer periphery.

The greater the relative speed or the greater the out-of-plane deformation of the metal washer 20, the higher the risk of producing debris.

Since the gap between the inclined surface 19b and the metal washer 20 increases toward the outer periphery, there is an effect of mitigating an increase in the risk of generation of debris due to an increase in the relative speed or the out-of-plane deformation.

The flat surface 19a disposed on an inner peripheral side of the inclined surface 19b also contributes to prevent debris from being generated.

When the washer-equipped screw 2 is tightened to the object, the flat surface 19a comes into contact with the metal washer 20 before the inclined surface 19b strongly slides on the metal washer 20.

When an inner peripheral side of the surface of the metal washer 20 comes into contact with the flat surface 19a, a position of the metal washer 20 is adjusted in a direction orthogonal to the axial line CL.

Further, when the inner peripheral side of the metal washer 20 is pressed against the flat surface 19a, out-of-plane deformation of the metal washer 20 is corrected.

As a result, local sliding between the metal washer 20 and the inclined surface 19b on the outer peripheral side with a high relative speed can be suppressed from occurring.

Further, the magnitude of the out-of-plane deformation of the metal washer 20 is smaller in the inner peripheral side than that in the outer peripheral side.

Even if the metal washer 20 and the flat surface 19a slide first on the inner peripheral side where the out-of-plane deformation is small, the possibility of occurrence of debris is smaller compared with the outer peripheral side.

When the reaction force of the rubber washer 30 exceeds a static friction coefficient between the flat surface 19a on the inner periphery side and the metal washer 20 as the screw body 10 is tightened, the metal washer 20 and the seat surface 19 (the screw body 10) tend to rotate together, and the relative speed on the outer peripheral side becomes zero.

As a result, debris is almost completely suppressed from being produced.

An inclination angle Ang of the inclined surface 19b with respect to the orthogonal direction of the axis CL is preferably between 5 degrees and 10 degrees.

However, the inclination angle Ang is determined in consideration of the magnitude of the reaction force of the rubber washer 30, the area of the inclined surface 19b, and the like.

When tightening the screw body 10 to the object to be fixed, an outer edge of the flat surface 19a (that is, a part indicated by a reference symbol P in FIG. 3) is adjusted so that a sufficient load can be applied to the metal washer 20 (that is, to the rubber washer 30).

More specifically, the position of the outer edge of the flat surface 19a is adjusted so that the sufficient load can be applied to the metal washer 20 (that is, to the rubber washer 30) before the inclined surface 19b is strongly slid with the metal washer 20.

Points to be noted regarding the technique described in the embodiments will be described.

A boundary between the flat surface 19a and the inclined surface 19b (the part indicated by the reference symbol P in FIG. 3) may be changed sharply or may be rounded.

It is more suitable for preventing debris from being generated if the boundary is rounded.

As shown in FIG. 3, the seat surface 19 of the screw body 10 has the flat surface 19a on an inner side of the inclined surface 19b.

As described above, although the flat surface 19a can also be expected to have an effect of suppressing debris from being generated, the entire surface of the seat surface 19 may be an inclined surface without providing the flat surface 19a.

Figure 4:
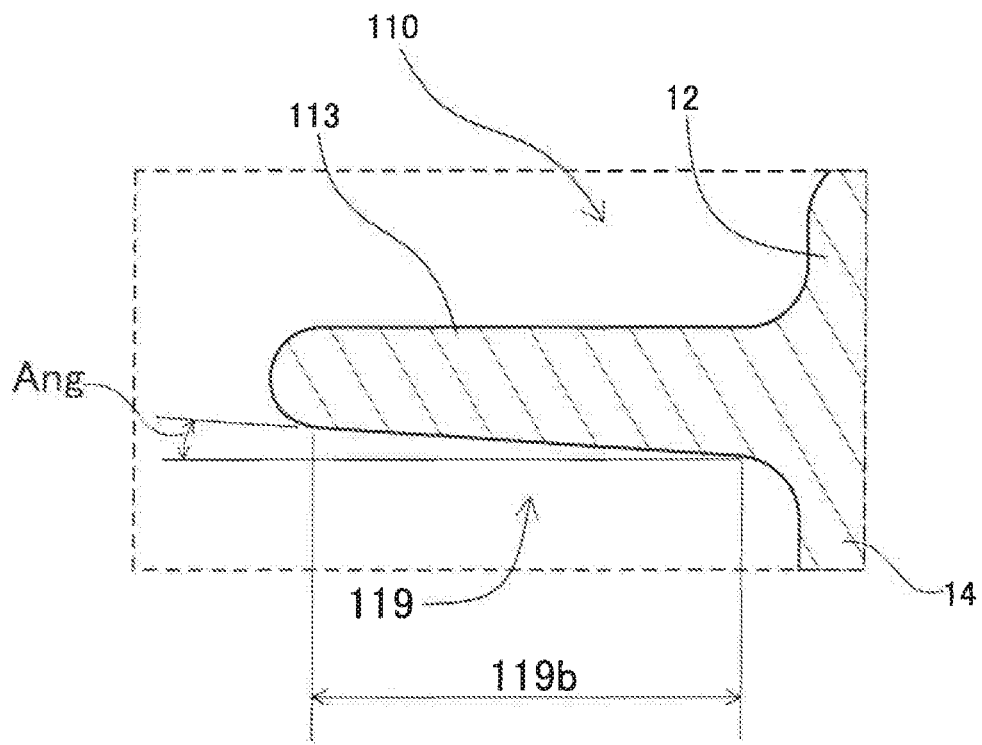
FIG. 4 is an enlarged sectional view showing a modified example of an inclined surface.

FIG. 4 shows a modified example in which the entire seat surface is inclined.

In an example of FIG. 4, an entire seat surface 119 (a flange surface on the cylindrical portion 14 side of a flange 113) of a screw body 110 is an inclined surface 119b which is inclined so as to be recede from the metal washer toward an outer periphery.

The washer-equipped screw 2 of the embodiment is suitable for fixing circuit boards.

Since the rubber washer 30 presses the circuit board with its elastic force, the circuit board can be firmly fixed without damaging the circuit board.

Further, as described above, it is also preferable to fix the circuit board by suppressing debris from being generated due to sliding between the metal washer 20 and the seat surface 19.

However, the washer-equipped screw disclosed in the present specification is not limited to one that fixes the circuit board.

Further, the washer-equipped screw 2 of the embodiment is a type of a screw having the groove 16 in its head portion for fitting a screwdriver.

The screw in the present specification includes a bolt with a polygonal head. That is, the technique disclosed in the present specification can also be preferably applied to bolts.

Although specific examples of the present invention have been described in detail above, they are merely illustrative and do not limit the scope of the claims.

The technology described in the scope of claims includes various modifications and modifications of the specific examples exemplified above.

The technical elements described in the present specification or the drawings alone exhibit technical usefulness by various combinations and are not limited to combinations described in the claims at the time of filing.

In addition, the technology exemplified in the present specification or the drawings can achieve plural objectives at the same time, and has technical usefulness by itself achieving one of them.

What is claimed is:

1. A washer-equipped screw comprising:
   a screw body having a cylindrical portion disposed between a shaft portion on which a screw groove is formed and ahead portion;
   a metal washer of which a hole is inserted through the cylindrical portion so as to be adjacent to the head portion, the metal washer being flat; and
   a rubber washer of which a hole is inserted through the cylindrical portion and positioned on a shaft portion side of the metal washer, wherein:
   a seat surface of the head portion has an inclined surface inclined away from the metal washer toward an outer radial periphery of the seat surface.

2. A washer-equipped screw according to claim 1, wherein:
   the seat surface includes a flat surface orthogonal to an axial line of the screw body and the inclined surface extending toward an outer peripheral side of the flat surface.

3. A washer-equipped screw according to claim 2, wherein:
   the seat surface is a flange surface of a flange disposed on the head portion on the shaft portion side.

4. A washer-equipped screw according to claim 1, wherein the inclined surface has an inclination angle of between 5 to 10 degrees.

* * * * *